United States Patent
Wang et al.

(10) Patent No.: US 6,756,300 B1
(45) Date of Patent: Jun. 29, 2004

(54) METHOD FOR FORMING DUAL DAMASCENE INTERCONNECT STRUCTURE

(75) Inventors: Fei Wang, San Jose, CA (US); Jerry Cheng, Milpitas, CA (US); Lynne A. Okada, Sunnyvale, CA (US); Minh Quoc Tran, Milpitas, CA (US); Lu You, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 34 days.

(21) Appl. No.: 10/324,259

(22) Filed: Dec. 18, 2002

(51) Int. Cl.[7] .......................................... H01L 21/4763
(52) U.S. Cl. ..................................................... 438/637
(58) Field of Search ................................ 438/637, 689, 438/700

(56) References Cited

U.S. PATENT DOCUMENTS 6,083,822 A * 7/2000 Lee ............................ 438/624
6,211,061 B1 * 4/2001 Chen et al. .................. 438/622
6,376,366 B1 * 4/2002 Lin et al. ..................... 438/637
6,524,963 B1 * 2/2003 Zhou et al. .................. 438/714
6,537,908 B2 * 3/2003 Fornof et al. ................ 438/638

* cited by examiner

Primary Examiner—Thao P. Le
(74) Attorney, Agent, or Firm—Monica H. Choi

(57) ABSTRACT

For forming a dual damascene opening within a dielectric material, a via mask material and a trench mask material are formed over the dielectric material. A trench opening is formed through the trench mask material, and a via opening is formed through a via mask patterning material disposed over the via and trench mask materials. The via and trench mask materials exposed through the via opening of the via mask patterning material are etched away, and the via mask patterning material is etched away. A portion of the dielectric material exposed through the via opening is etched down to the underlying interconnect structure, and a portion of the dielectric material exposed through the trench opening is etched, to form the dual damascene opening.

15 Claims, 7 Drawing Sheets

METHOD FOR FORMING DUAL DAMASCENE INTERCONNECT STRUCTURE

TECHNICAL FIELD

The present invention relates generally to interconnect technology in integrated circuit fabrication, and more particularly, to a method for forming a dual damascene interconnect structure with enhanced critical dimension of the via opening.

BACKGROUND OF THE INVENTION

Common components of a monolithic IC (integrated circuit) include interconnect structures such as metal lines for electrically connecting integrated circuit devices formed on a semiconductor substrate, as known to one of ordinary skill in the art of integrated circuit fabrication. A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and extruded metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

However, copper cannot be easily patterned in a deposition and etch process, and thus, copper interconnect structures are typically formed by forming and filling openings with copper within dielectric material, as known to one of ordinary skill in the art of integrated circuit fabrication. FIG. 1 for example shows a dual damascene opening 100 formed for fabricating a metal line and a via structure within a dielectric material 101 formed on an underlying interconnect structure 110 that is formed within an underlying dielectric material 103. The dual damascene opening 100 includes a via opening 102 having a critical dimension 104 and a trench opening 106 having a critical dimension 108.

The via opening 102 when filled with a conductive fill material forms a via structure, and the trench opening 106 when filled with the conductive fill material forms a metal line. The via structure formed with the via opening 102 couples the metal line formed with the trench opening 106 to the underlying interconnect structure 110. Such a dual damascene opening 100 is known to one of ordinary skill in the art of integrated circuit fabrication.

Referring to FIGS. 1 and 2, the via opening 102 and the trench opening 106 of the dual damascene opening 100 are filled with a conductive fill material 112 such as copper for example. Referring to FIGS. 2 and 3, the conductive fill material 112 is polished down until the dielectric material 101 is exposed such that the conductive fill material 112 is contained within the dual damascene opening 100. The conductive fill material 112 filling the via opening 102 forms the via structure 114, and the conductive fill material 112 filling the trench opening 106 forms the metal line 116.

In the case the conductive fill material 112 is comprised of copper, a diffusion barrier material (not shown in FIGS. 2 and 3) is also typically formed to surround the copper fill material 112 to prevent the diffusion of copper into the surrounding dielectric material 101. Copper is a mid-bandgap impurity in silicon, silicon dioxide, and other dielectric materials. Thus, copper may diffuse easily into these common integrated circuit materials to degrade the circuit performance of integrated circuits. To prevent such undesired diffusion of copper, a diffusion barrier layer material is deposited to surround the copper interconnect at the interface between the copper interconnect and the surrounding material, as known to one of ordinary skill in the art of integrated circuit fabrication.

FIGS. 4, 5, 6, 7, and 8 illustrate cross-sectional views for forming a dual damascene opening according to the prior art. Referring to FIG. 4, in the case that the underlying interconnect structure 110 is comprised of copper, a layer of diffusion barrier material 122 is deposited on the underlying interconnect structure 110 and the underlying dielectric material 103. In addition, a layer of dielectric material 124 for having the dual damascene opening formed therein is deposited on the layer of diffusion barrier material 122. Then, a layer of via hard-mask material 126 is deposited on the layer of dielectric material 124, and a layer of trench hard-mask material 128 is deposited on the layer of via hard-mask material 126.

Referring to FIG. 5, a trench mask patterning material 130 (comprised of photo-resist material for example) is deposited and patterned to form a trench opening 132 through the trench mask patterning material 130 and the trench hard-mask material 128. Referring to FIGS. 6 and 7, after formation of the trench opening 132 through the trench hard-mask material 128, the trench mask patterning material 130 is etched away. Then, referring to FIG. 7, a via mask patterning material 133 (comprised of photo-resist material for example) is deposited and patterned to form a via opening 134 through the via hard-mask material 126.

Referring to FIGS. 6 and 7, after forming the via opening 134 through the via hard-mask material 126, the via mask patterning material 133 is etched away. Then, a portion of the dielectric material 124 exposed through the via opening 134 of the via hard-mask material 126 is etched away such that the via opening 134 extends approximately half-way down the total thickness of the layer of dielectric material 124 in a first etch process.

Referring to FIGS. 7 and 8, another etch process is performed for etching away the portion of the via hard-mask material 126 exposed through the trench opening 132 of the trench hard-mask material 128. In addition, exposed portions of the dielectric material 124 are etched away such that the trench opening 132 extends approximately half-way down the total thickness of the layer of dielectric material 124. Furthermore, the remaining half of the thickness of the layer of dielectric material 124 and the portion of the diffusion barrier material 122 exposed through the via opening 134 are etched away such that the via opening 134 extends down to the underlying interconnect structure 110.

The trench opening 132 and the via opening 134 form the dual damascene opening 140.

A disadvantage of the prior art process for forming the dual damascene opening 140 is that a first critical dimension 136 as patterned for the via opening 134 in the via mask patterning material 133 in FIG. 6 is desired. However, because of mis-alignment during patterning processes, a second critical dimension 138 of the via opening 134 results that is smaller than the desired critical dimension 136, as illustrated in FIG. 7. Such smaller critical dimension 138 of the via opening 134 disadvantageously increases the aspect ratio of the via opening 134 which in turn increases the resistance and the probability for electromigration failure of the dual damascene interconnect structure.

Referring to FIGS. 6 and 7, the trench hard-mask material 128 may be comprised of a metal such as tantalum, tantalum nitride (TaN), or titanium nitride (TiN), and the via hard-mask material 126 may be comprised of a capping layer material such as silicon carbide (SiC) or silicon oxynitride (SiON). In that case, with misalignment of the via opening 134 formed through the via mask patterning material 133 in FIG. 6, the portion of the via hard-mask material 126 that is exposed through the via opening 136 in the via mask patterning material 133 but that is covered under the trench hard-mask material 128 is not etched away. Thus, the second critical dimension 138 of the via opening 134 formed through the via hard-mask material 126 is compromised to be smaller than the desired critical dimension 136.

Thus, a mechanism is desired for forming a dual damascene opening with the critical dimension of the via opening not being compromised despite possible mis-alignment during patterning processes.

SUMMARY OF THE INVENTION

Accordingly, in a general aspect of the present invention, a dual damascene opening is formed with a desired critical dimension of the via opening even with potential misalignment of patterning processes.

In one embodiment of the present invention, for forming a dual damascene interconnect structure, a layer of dielectric material is deposited on an underlying interconnect structure. In addition, a layer of via hard-mask material is deposited on the layer of dielectric material, and a layer of trench hard-mask material is deposited on the layer of via hard-mask material. A trench opening is formed through the trench hard-mask material. Furthermore, a via mask patterning material is deposited and patterned to form a via opening through the via mask patterning material. An etch process is performed for etching away any portion of the trench hard-mask material exposed through the via opening of the via mask patterning material, and for etching the via opening through a portion of the via hard-mask material exposed through the via opening of the via mask patterning material.

For forming a dual damascene opening, the via mask patterning material is etched away after forming the via opening through the via hard-mask material. The portion of the dielectric material exposed through the via opening of the via hard-mask material is etched down to the underlying interconnect structure, and the trench opening is etched through a portion of the dielectric material exposed through the trench opening of the trench hard-mask material.

In an example embodiment of the present invention, a high-temperature and high-pressure directional etch process is performed with fluorine as an etching agent within an etching chamber for etching the via opening through the via hard-mask material. For the high-temperature and high-pressure etch process, carbon tetra-fluoride ($CF_4$) flows through the etching chamber with a flow rate of from about 50 sccm (standard cubic centimeters per minute) to about 400 sccm (standard cubic centimeters per minute). In addition, oxygen ($O_2$) flows through the etching chamber with a flow rate of from about 50 sccm (standard cubic centimeters per minute) to about 400 sccm (standard cubic centimeters per minute). Furthermore, the temperature within the etching chamber is set to be in a range of from about 40° Celsius to about 150° Celsius, and the pressure within the etching chamber is set to be in a range of from about 0.5 Torr to about 1.5 Torr.

With such a high-temperature and high-pressure etch process, any portion of the trench hard-mask material exposed through the via opening of the via mask patterning material is also etched away such that the desired critical dimension of the via opening is attained, even when the trench hard-mask material is comprised of a metal such as tantalum, tantalum nitride (TaN), or titanium nitride (TiN). With any exposed portion of the trench hard-mask material etched away during etching of the via opening, the critical dimension of the via opening is not compromised by any remaining trench hard-mask material from misalignment of patterning processes. A higher desired critical dimension of the via opening ensures that the resistance and the probability of electromigration failure of the dual damascene interconnect structure formed with such a via opening is not increased.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, and 18 refer to elements having similar structure and function.

DETAILED DESCRIPTION

Figure 9:
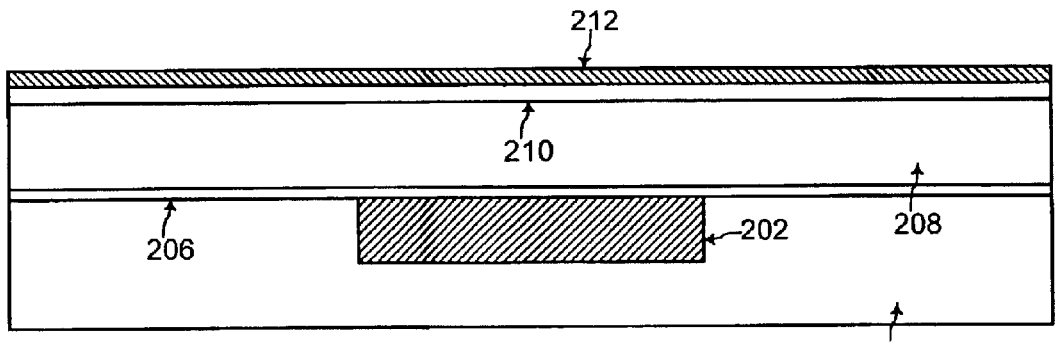
FIGS. 9, 10, 11, 13, 14, 15, 16, 17, and 18 show cross-sectional views for forming a dual damascene opening with etching away any exposed portion of a trench hard-mask material during patterning of a via hard-mask material such that the critical dimension of the via opening is not compromised from potential misalignment during patterning processes, according to an embodiment of the present invention.

Referring to FIG. 9, a dual damascene interconnect structure according to an embodiment of the present invention is formed on an underlying interconnect structure 202 that is formed within an underlying dielectric material 204. The underlying dielectric material 204 is formed on a semiconductor substrate such as a silicon substrate (that is not illustrated in FIG. 9). Further referring to FIG. 9, for forming the dual damascene opening according to an embodiment of the present invention, in the case that the underlying interconnect structure 202 is comprised of copper, a layer of diffusion barrier material 206 is deposited on the underlying interconnect structure 202 and the underlying dielectric material 204.

The diffusion barrier material 206 prevents diffusion of copper of the underlying interconnect structure 202 into any surrounding dielectric material. In one embodiment of the present invention, the diffusion barrier material 206 is comprised of silicon carbide (SiC) or silicon nitride (SiN). Such diffusion barrier material and processes for depositing such a layer of diffusion barrier material 206 are known to one of ordinary skill in the art of integrated circuit fabrication. In addition, in the case that the underlying interconnect structure 202 is comprised of copper, a diffusion barrier material (not shown in FIG. 9) would typically also be formed to surround the underlying interconnect structure 202 at the interface between the underlying interconnect structure 202 and the underlying dielectric material 204.

Further referring to FIG. 9, a layer of dielectric material 208 is deposited on the layer of diffusion barrier material 206. The layer of dielectric material 208 is comprised of silicon dioxide ($SiO_2$) or a low-k dielectric material having a dielectric constant lower than that of silicon dioxide ($SiO_2$), and processes for deposition of such dielectric material 208 are known to one of ordinary skill in the art of integrated circuit fabrication.

In addition, a layer of via hard-mask material 210 is deposited on the layer of dielectric material 208, and a layer of trench hard-mask material 212 is deposited on the layer of via hard-mask material 210. The layer of via hard-mask material 210 is comprised of a capping material such as silicon carbide (SiC) or silicon oxynitride (SiON), according to one embodiment of the present invention. In addition, the layer of trench hard-mask material 212 is comprised of a metal such as tantalum, tantalum nitride (TaN), or titanium nitride (TiN), for example, according to one embodiment of the present invention. Processes for depositing such layers of the via hard-mask material 210 and the trench hard-mask material 212 are known to one of ordinary skill in the art of integrated circuit fabrication.

Figure 10:
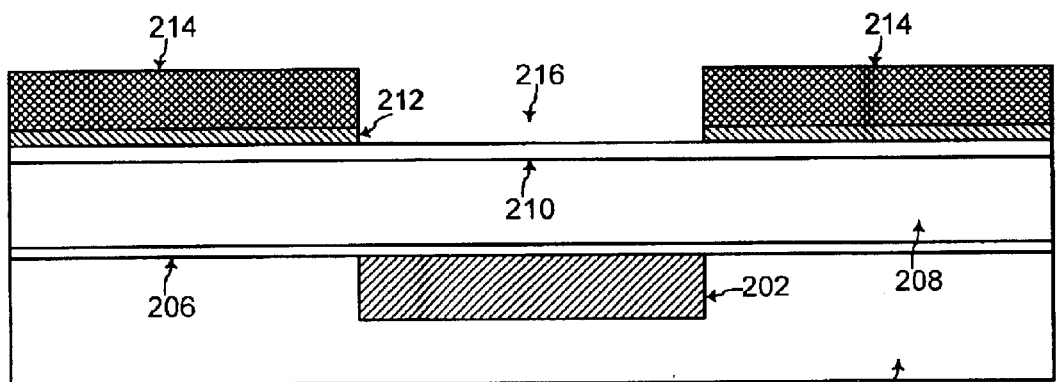

Referring to FIGS. 9 and 10, a trench mask patterning material 214 is deposited and patterned to form a trench opening 216 therein. The trench mask patterning material 214 is comprised of photoresist material according to one embodiment of the present invention. Processes for deposition and patterning of such trench mask patterning material 214 to form the trench opening 216 are known to one of ordinary skill in the art of integrated circuit fabrication.

Further referring to FIG. 10, the portion of the trench hard-mask material 212 exposed through the trench opening 216 in the trench mask patterning material 214 is etched away such that the trench opening 216 is formed through the trench hard-mask material 212. Processes for etching away the exposed portion of the trench hard-mask material 212 which is comprised of a metal such as tantalum, tantalum nitride (TaN), or titanium nitride (TiN), for example, are known to one of ordinary skill in the art of integrated circuit fabrication.

Figure 11:
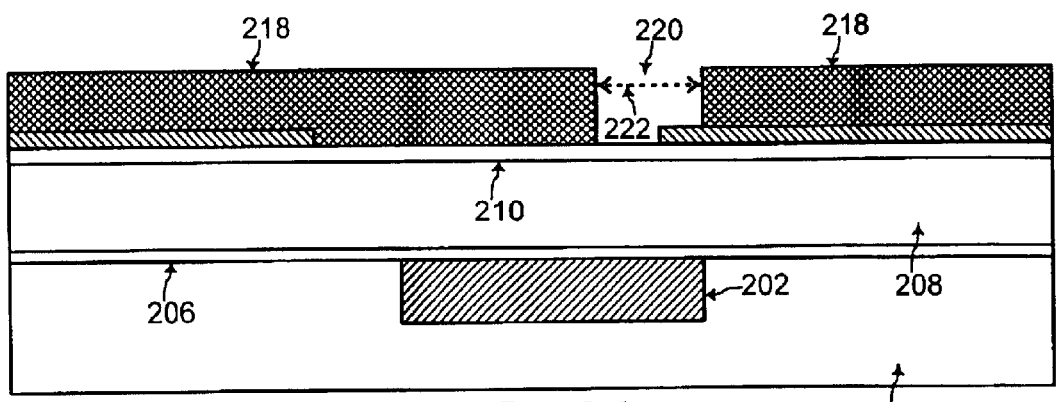

Referring to FIGS. 10 and 11, after the trench opening 216 is formed through the trench hard-mask material 212, the trench mask patterning material 214 is etched away. Processes for etching away the remaining trench mask patterning material 214 which may be comprised of photo-resist material for example are known to one of ordinary skill in the art of integrated circuit fabrication.

Further referring to FIG. 11, a via mask patterning material 218 is then deposited and patterned to form a via opening 220 having a critical dimension 222. The via mask patterning material 218 is comprised of photo-resist material according to one embodiment of the present invention. Processes for deposition and patterning of such via mask patterning material 218 to form the via opening 220 are known to one of ordinary skill in the art of integrated circuit fabrication.

Referring to FIG. 11, note that because of mis-alignment of the patterning process during formation of the via opening 220 in the via mask patterning material 218, a portion of the trench hard-mask material 212 is exposed through the via opening 220. According to an aspect of the present invention, for further etching the via opening 220 through the exposed portion of the trench hard-mask material 212 and the via hard-mask material 210, a semiconductor wafer 224 having the materials of the cross-sectional views of FIGS. 9, 10, and 11 formed thereon is placed within an etching chamber 226 of FIG. 12.

Figure 12:
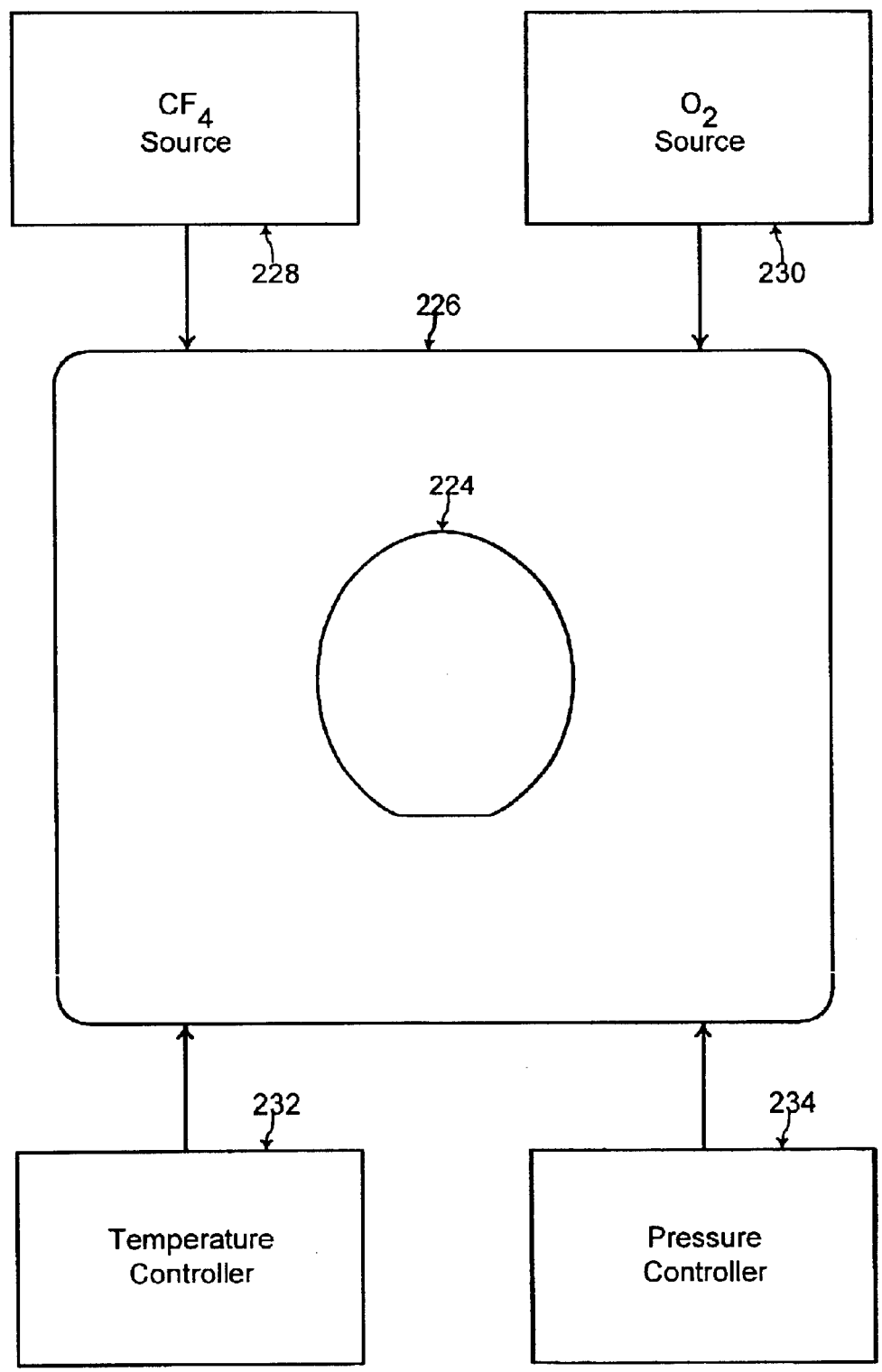
FIG. 12 shows components of an etching chamber used for etching away any exposed portion of the trench hard-mask material during patterning of the via hard-mask material to form the via opening, according to an embodiment of the present invention.

Referring to FIG. 12, the etching chamber 226 is for a directional etch of material using fluorine as an etching agent. Thus, a carbon tetra-fluoride ($CF_4$) source 228 is coupled to the etching chamber 226, and an oxygen ($O_2$) source 230 is also coupled to the etching chamber 226. Furthermore, a temperature controller 232 and a pressure controller 234 are coupled to the etching chamber 226. Etching chambers for directional etch processes in general are known to one of ordinary skill in the art of integrated circuit fabrication.

In one embodiment of the present invention, carbon tetra-fluoride (CF4) flows from the carbon tetra-fluoride ($CF_4$) source 228 into the etching chamber 226 with a flow rate in a range of from about 50 sccm (standard cubic centimeters per minute) to about 400 sccm (standard cubic centimeters per minute). In addition, oxygen ($O_2$) flows from the oxygen ($O_2$) source 230 through the etching chamber 226 with a flow rate in a range of from about 50 sccm (standard cubic centimeters per minute) to about 400 sccm (standard cubic centimeters per minute).

Furthermore, referring to FIG. 12, the temperature controller 232 controls the temperature within the etching chamber 226 to be set in a range of from about 40° Celsius to about 150° Celsius. In addition, the pressure controller 234 controls the pressure within the etching chamber 226 to be set in a range of from about 0.5 Torr to about 1.5 Torr. Such a temperature controller 232 and such a pressure controller 234 are each individually known to one of ordinary skill in the art of integrated circuit fabrication.

Figure 13:
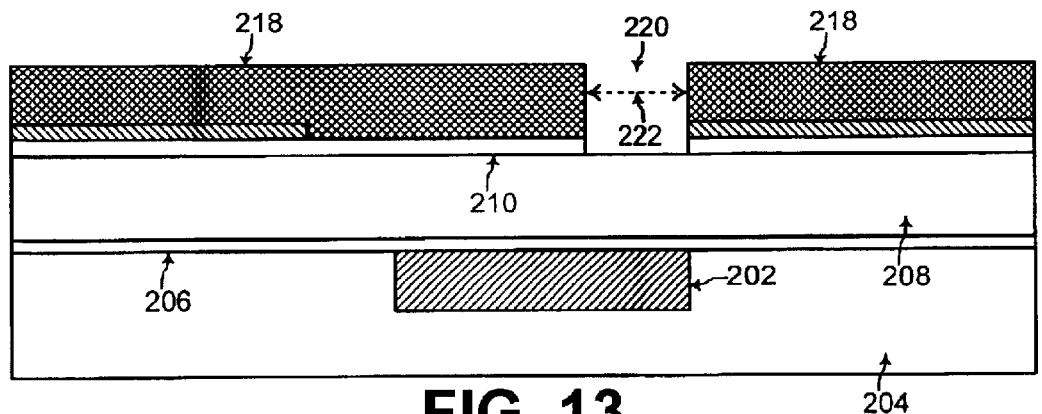

Referring to FIGS. 11, 12, and 13, when the semiconductor wafer 224 having the materials of the cross-sectional view of FIG. 11 is placed within the etching chamber 226, a directional etch process with fluorine from the carbon tetra-fluoride ($CF_4$) as the etching agent is performed. Thus, the fluorine from the carbon tetra-fluoride ($CF_4$) as the etching agent etches away the portion of the trench hard-mask material 212 and the portion of the via hard-mask material 210 exposed through the via opening 220. As a result, the via opening 220 is formed through the trench hard-mask material 212 and through the via hard-mask material 210 to have the critical dimension 222 as formed through the via mask patterning material 218 as illustrated in FIG. 13.

Note that the combination of the use of the fluorine from the carbon tetra-fluoride ($CF_4$) as the etching agent, the relatively high temperature in a range of from about 40° Celsius to about 150° Celsius, and the relatively high pressure in a range of from about 0.5 Torr to about 1.5 Torr, within the etching chamber 226 causes the portion of the trench hard-mask material 212 exposed through the via opening 220 to be etched away within the etching chamber 226 even when the trench hard-mask material 212 is comprised of a metal such as tantalum, tantalum nitride (TaN), or titanium nitride (TiN), for example.

Figure 1:
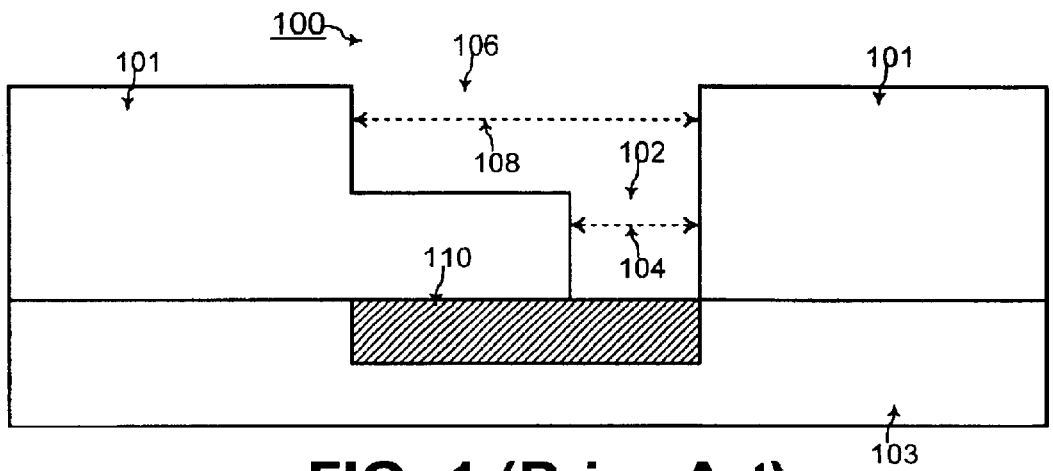
FIGS. 1, 2, and 3 show cross-sectional views for forming a typical dual damascene opening and interconnect structure according to the prior art.
Figure 2:
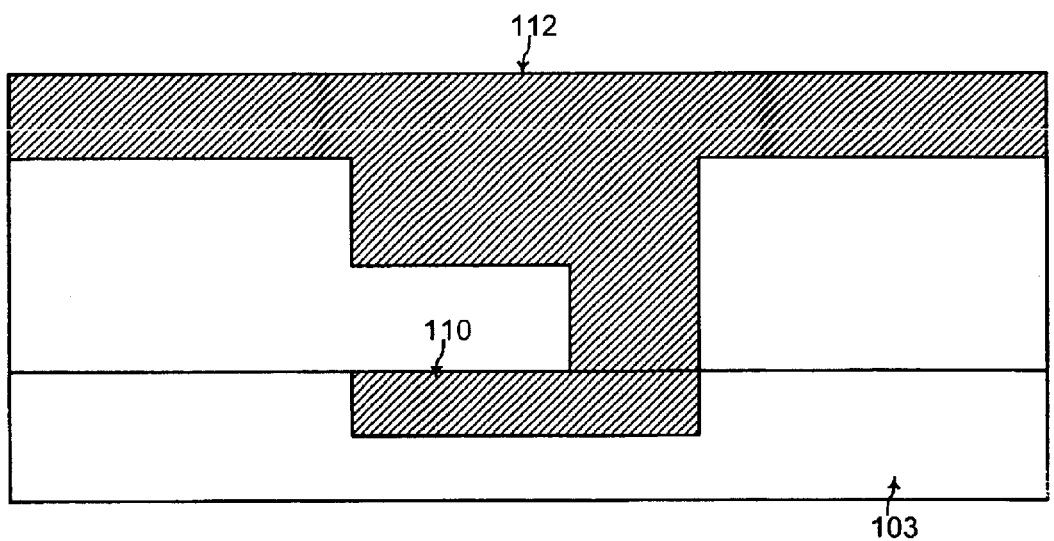
Figure 3:
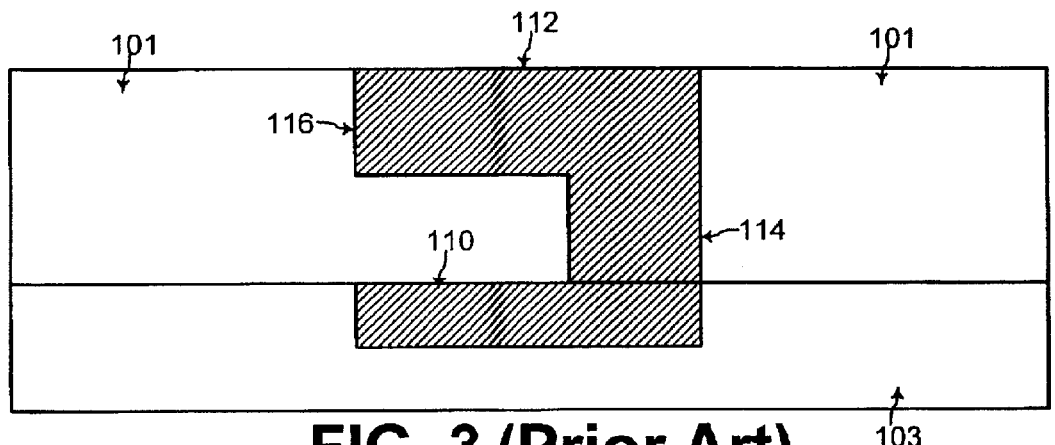
Figure 4:
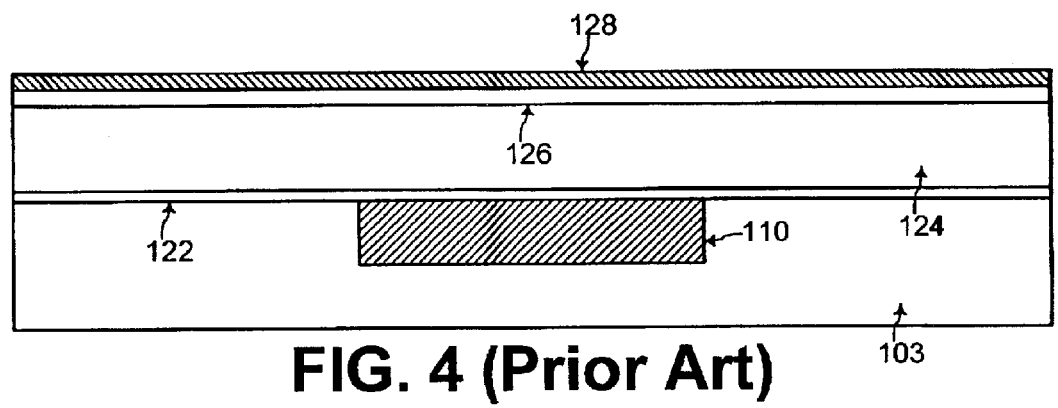
FIGS. 4, 5, 6, 7, and 8 show cross-sectional views for forming a dual damascene opening with misalignment from patterning processes resulting in a decreased critical dimension of the via opening, according to the prior art.
Figure 5:
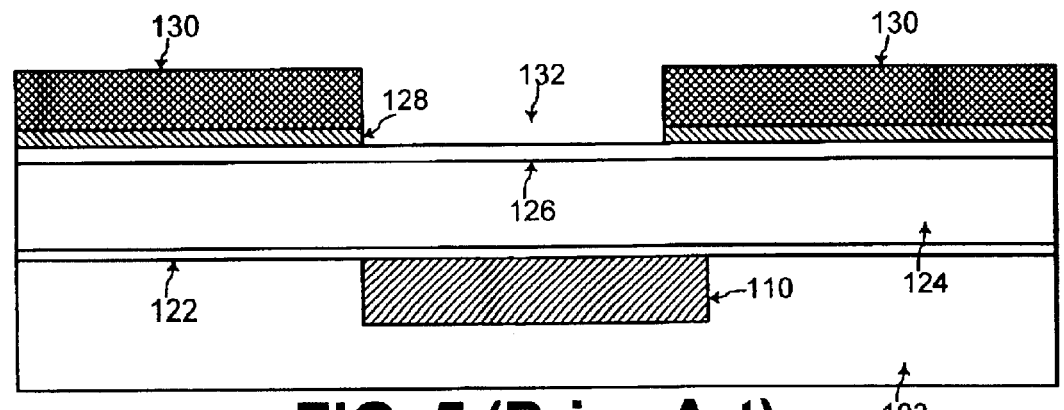
Figure 6:
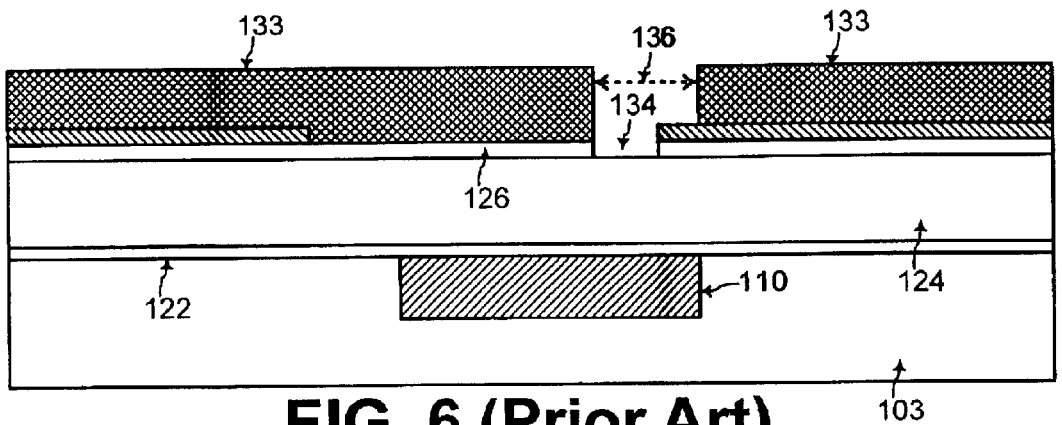
Figure 7:
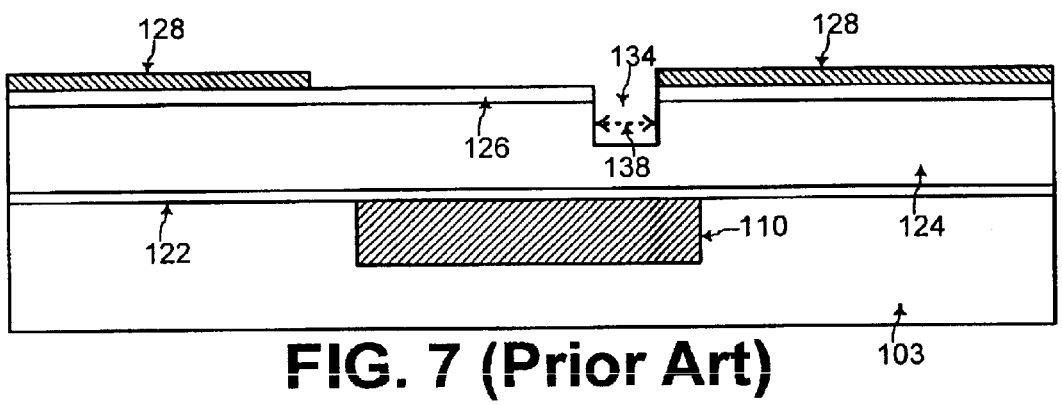
Figure 8:
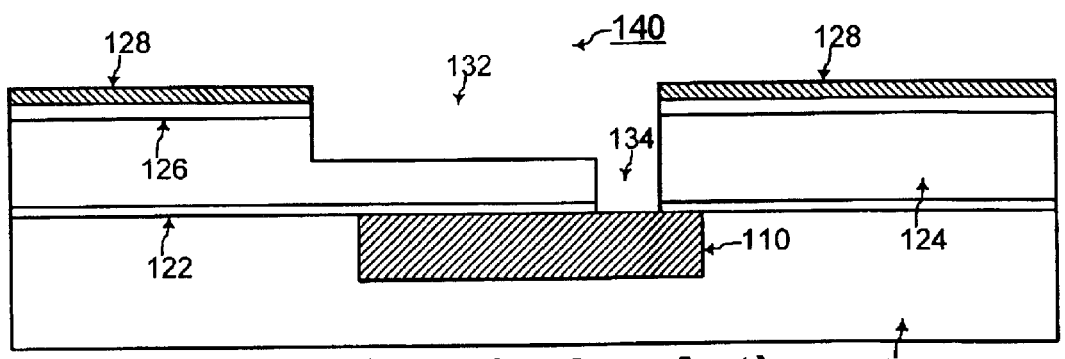

In contrast, referring to FIG. 6 of the prior art, because fluorine is not used as an etching agent, and because a relatively lower temperature in a range of from about 25° Celsius to about 40° Celsius is used, and because a relatively lower pressure in a range of from about 30 milli-Torr to about 50 milli-Torr is used, the exposed portion of the trench hard-mask material is not etched away. Thus, in the prior art, the exposed portion of the trench hard-mask material formed from mis-alignment of the via opening formed through the via mask patterning material decreases the dimension of the via opening formed through the via hard-mask material.

Figure 14:
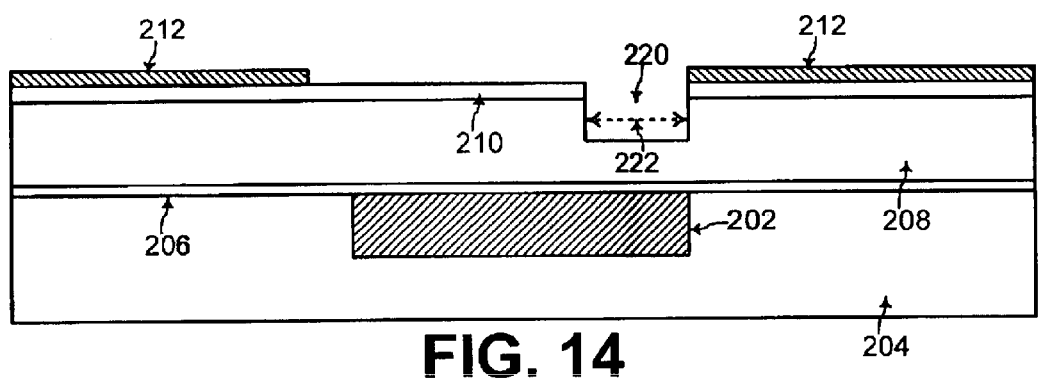

Referring to FIGS. 13 and 14, after the via opening 220 having the desired critical dimension 222 is formed through the via hard-mask material 210, the via mask patterning material 218 is etched away. Processes for etching away the remaining via mask patterning material 218 which may be comprised of photo-resist material for example are known to one of ordinary skill in the art of integrated circuit fabrication.

Further referring to FIG. 14, a portion of the dielectric material 208 exposed through the via opening 220 of the via hard-mask material 210 is etched away. In one embodiment of the present invention, the via opening 220 is etched approximately half-way down the total thickness of the dielectric material 208. Processes for etching the dielectric material 208, which may be comprised of silicon dioxide ($SiO_2$) or a low-k dielectric material for example, to form the via opening 220 in FIG. 14 are known to one of ordinary skill in the art of integrated circuit fabrication.

Figure 15:
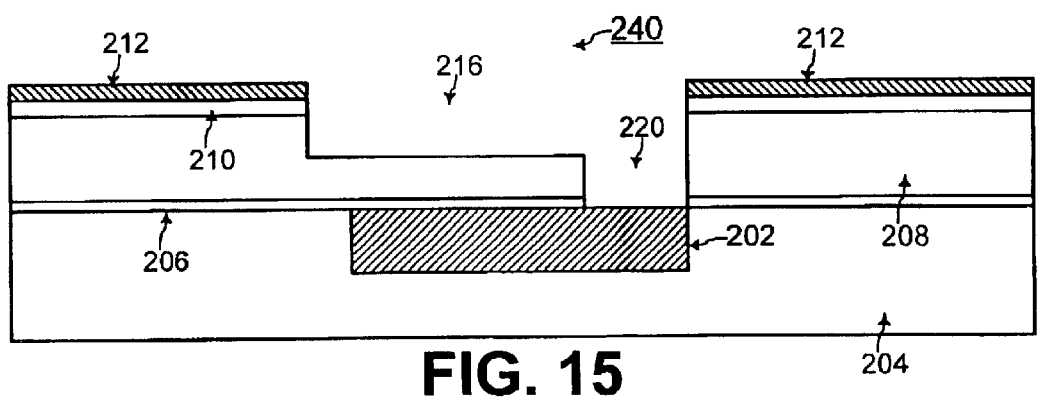

Referring to FIGS. 14 and 15, the portion of the via hard-mask material 210 exposed through the trench opening 216 of the trench hard-mask material 212 is etched away. In addition, further referring to FIG. 15, the portion of the dielectric material 208 exposed through the trench opening 216 of the trench hard-mask material 212 is also etched away to form the trench opening 216 approximately half-way down the total thickness of the dielectric material 208. Furthermore, during etching of the trench opening 216, the portion of the dielectric material 208 exposed through the via opening 220 is further etched away to form the via opening 220 all the way down through the dielectric material 208 and through the diffusion barrier material 206 to the underlying interconnect structure 202.

Processes such as directional etch processes for etching the exposed portion of the via hard-mask material 210 (which may be comprised of silicon carbide (SiC) or silicon oxynitride (SiON) for example), the exposed portions of the dielectric material 208 (which may be comprised of silicon dioxide ($SiO_2$) or a low-k dielectric material for example), and the exposed portion of the diffusion barrier material 206, to form the trench opening 216 and the via opening 220 are known to one of ordinary skill in the art of integrated circuit fabrication. The trench opening 216 and the via opening 220 form a dual damascene opening 240 of an embodiment of the present invention.

However, the present invention may also be practiced when the via opening 220 through the via hard-mask material 210 and the trench opening 216 through the trench hard-mask material 212 are used to etch through the dielectric material 208 to form the dual damascene opening 240 in a different manner. For example, when the dielectric material 208 is comprised of a stack of different types of dielectric material, the via opening 220 through the via hard-mask material 210 may first be used to etch all the way down to the underlying interconnect structure 202. In that case, the trench opening 216 through the trench hard-mask material 212 would there-after be used to etch half-way down the dielectric material 208 to form the trench opening 216.

Figure 16:
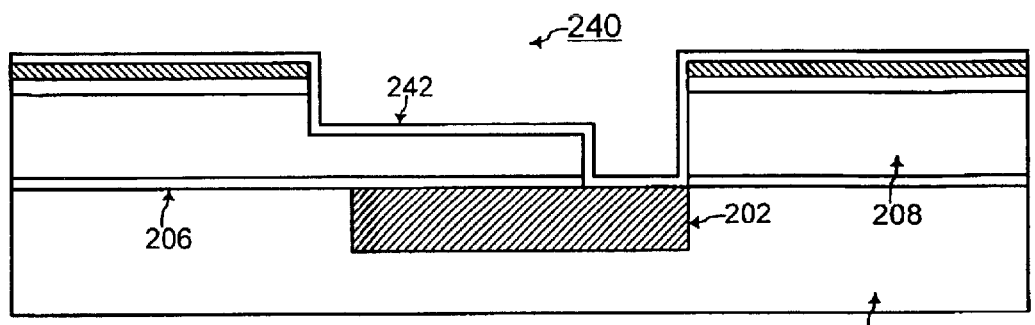
Figure 17:
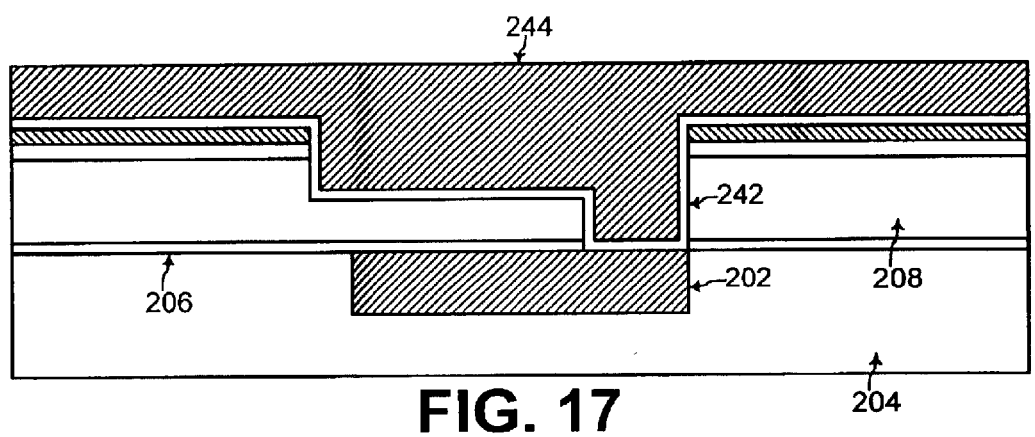

Referring to FIGS. 15 and 16, if the conductive fill material for filling the dual damascene opening 240 is comprised of copper, a diffusion barrier material 242 is first deposited on the walls of the dual damascene opening 240. Diffusion barrier materials and processes for deposition of diffusion barrier materials are known to one of ordinary skill in the art of integrated circuit fabrication. Referring to FIGS. 16 and 17, a conductive fill material 244 such as copper for example is deposited to fill the dual damascene opening 240. Processes for depositing such a conductive fill material 244 to fill the dual damascene opening 240 are known to one of ordinary skill in the art of integrated circuit fabrication.

Figure 18:
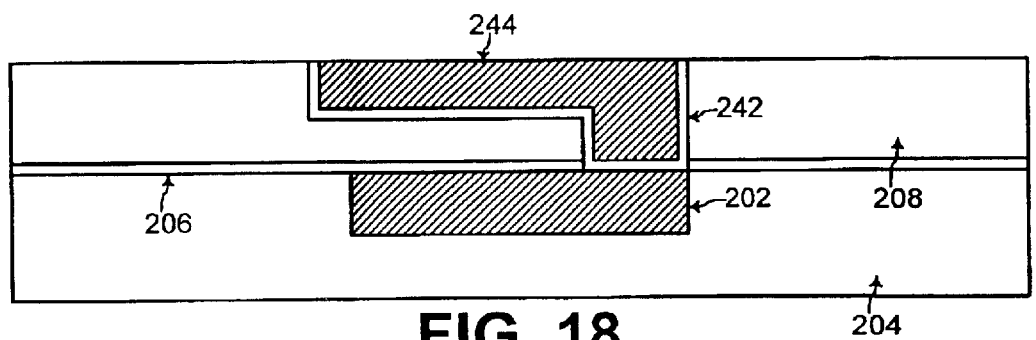

Referring to FIGS. 17 and 18, the materials on the dielectric material 208 are polished down until the dielectric material 208 is exposed such that the conductive fill material 244 is contained within the dual damascene opening 240 to form the dual damascene interconnect structure. Processes such as CMP (chemical mechanical polishing) processes for polishing down the materials on the dielectric material 208 until the dielectric material 208 is exposed are known to one of ordinary skill in the art of integrated circuit fabrication.

In this manner, referring to FIGS. 12 and 13, with use of the fluorine etching agent and the relatively high-temperature and high-pressure etch process within the etching chamber 226 for etching the via opening 220, any portion of the trench hard-mask material 212 exposed through the via opening 220 of the via mask patterning material 218 is also etched away such that the desired critical dimension 222 of the via opening 220 is attained through the via hard-mask material 210, even when the trench hard-mask material 212 is comprised of a metal such as tantalum, tantalum nitride (TaN), or titanium nitride (TiN), for example. With any exposed portion of the trench hard-mask material 212 etched away during etching of the via opening 220 in FIG. 13, the critical dimension 222 of the via opening 220 is not compromised by any remaining trench hard-mask material 212 from misalignment of the patterning process for the via mask patterning material 218. A higher desired critical dimension 222 of the via opening 220 ensures that the resistance and the probability of electromigration failure of the dual damascene interconnect structure formed with such a via opening 220 is not increased.

The foregoing is by way of example only and is not intended to be limiting. Any specified material or any specified dimension of any structure described herein is by way of example only. For example, the present invention may be used when the dual damascene opening is filled with any type of conductive fill material aside from the example of copper. In addition, as will be understood by those skilled in the art, the structures described herein may be made or used in the same way regardless of their position and orientation. Accordingly, it is to be understood that terms and phrases such as "on," and "underlying" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method of forming a dual damascene opening within a dielectric material, including the steps of:

forming a via mask material and a trench mask material over the dielectric material, wherein the via and trench mask materials are different materials;

forming a trench opening through the trench mask material;

forming an opening through a via mask patterning material disposed over the via and trench mask materials; and etching away the via mask material and any trench mask material exposed through the opening defined by the via mask patterning material to form a via opening through the via mask material.

2. The method of claim 1, wherein the step of forming the trench opening includes the steps of:

forming the trench opening through a trench mask patterning material disposed over the trench mask material;

etching away the trench mask material exposed through the trench opening of the trench mask patterning material; and etching away the trench mask patterning material.

3. The method of claim 1, further including the steps of:

etching away the via mask patterning material;

etching a portion of the dielectric material exposed through the via opening down to the underlying interconnect structure, and etching a portion of the dielectric material exposed through the trench opening, to form the dual damascene opening.

4. The method of claim 3, further including the step of:

filling the via opening and the trench opening with an interconnect fill material.

5. The method of claim 4, wherein the interconnect fill material is comprised of copper.

6. The method of claim 5, wherein the dielectric material is deposited onto an underlying interconnect structure, the method further including the step of:

depositing a layer of diffusion barrier material between the underlying interconnect structure and the dielectric material;

wherein the via opening is etched through a portion of the diffusion barrier material exposed through the via opening.

7. The method of claim 6, wherein the diffusion barrier material is comprised of one of silicon carbide (SiC) or silicon nitride (SiN).

8. The method of claim 1, wherein the trench mask material is comprised of a metal.

9. The method of claim 8, wherein the trench mask material is comprised of one of tantalum (Ta), tantalum nitride (TaN), or titanium nitride (TiN).

10. The method of claim 8, wherein the step of etching away the via and trench mask materials exposed through the via opening includes the step of:

performing a directional etch process with fluorine as an etching agent.

11. A method of forming a dual damascene opening within a dielectric material, including the steps of:

forming a via mask material and a trench mask material comprised of a metal over the dielectric material;

forming a trench opening through the trench mask material;

forming a via opening through a via mask patterning material disposed over the via and trench mask materials; and etching away the via and trench mask materials exposed through the via opening of the via mask patterning material by performing a directional etch process with fluorine as an etching agent including the steps of:

flowing carbon tetra-fluoride ($CF_4$) through an etching chamber with a flow rate of from about 50 sccm (standard cubic centimeters per minute) to about 400 sccm (standard cubic centimeters per minute);

flowing oxygen ($O_2$) through the etching chamber with a flow rate of from about 50 sccm (standard cubic centimeters per minute) to about 400 sccm (standard cubic centimeters per minute);

setting a temperature within the etching chamber to be in a range of from about 40° Celsius to about 150° Celsius; and setting a pressure within the etching chamber to be in a range of from about 0.5 Torr to about 1.5 Torr.

12. The method of claim 1, wherein the dielectric material is comprised of one of silicon dioxide ($SiO_2$) or a low-K dielectric material.

13. The method of claim 1, wherein the via mask material is comprised of one of silicon carbide (SiC) or silicon oxynitride (SiON).

14. The method of claim 1, wherein the via mask patterning material is comprised of photo-resist material.

15. A method for forming a dual damascene interconnect structure, including the steps of:

A. depositing a layer of diffusion barrier material on an underlying interconnect structure comprised of copper, wherein the diffusion barrier material is comprised of one of silicon carbide (SiC) or silicon nitride (SiN);

B. depositing a layer of dielectric material on the layer of diffusion barrier material, wherein the dielectric material is comprised of one of silicon dioxide ($SiO_2$) or a low-k dielectric material having a dielectric constant that is lower than the dielectric constant of silicon dioxide ($SiO_2$);

C. depositing a layer of via hard-mask material on the layer of dielectric material, wherein the via hard-mask material is comprised of one of silicon carbide (SiC) or silicon oxynitride (SiON);

D. depositing a layer of trench hard-mask material on the layer of via hard-mask material, wherein the trench hard-mask material is comprised of one of tantalum (Ta), tantalum nitride (TaN), or titanium nitride (TiN);

E. depositing and patterning a trench mask patterning material comprised of photo-resist material to form a trench opening through the trench mask patterning material and the layer of trench hard-mask material;

F. etching away the trench mask patterning material after forming the trench opening through the trench hard-mask material;

G. depositing and patterning a via mask patterning material comprised of photo-resist material to form a via opening through the via mask patterning material;

H. performing an etch process for etching away any portion of the trench hard-mask material exposed through the via opening of the via mask patterning material, and for etching the via opening through a portion of the via hard-mask material exposed through the via opening of the via mask patterning material wherein the etch process of the step H is a directional etch process with fluorine as an etching agent performed within an etching chamber with the added steps of:

flowing carbon tetra-fluoride ($CF_4$) through the etching chamber with a flow rate of from about 50 sccm (standard cubic centimeters per minute) to about 400 sccm (standard cubic centimeters per minute);

flowing oxygen ($O_2$) through the etching chamber with a flow rate of from about 50 sccm (standard cubic centimeters per minute) to about 400 sccm (standard cubic centimeters per minute);

setting a temperature within the etching chamber to be in a range of from about 40° Celsius to about 150° Celsius; and setting a pressure within the etching chamber to be in a range of from about 0.5 Torr to about 1.5 Torr, I. etching away the via mask patterning material after forming the via opening through the via hard-mask material;

J. etching a portion of the dielectric material and a portion of the diffusion barrier material exposed through the via opening of the via hard-mask material, down to the underlying interconnect structure;

K. etching the trench opening through a portion of the dielectric material exposed through the trench opening of the trench hard-mask material; and L. filling the via opening and the trench opening with an interconnect fill material comprised of copper.

* * * * *